United States Patent Office 3,497,354

Patented Feb. 24, 1970

3,497,354

LIGHT-SENSITIVE POLYETHER REPRODUCTION LAYER

Hartmut Steppan, Wiesbaden-Dotzheim, Johannes Munder, Wiesbaden-Biebrich, Gunter Messwarb, Kelkheim, and Walter Lüders Neu-Isenberg, Germany, assignors to Kalle Aktiengesellschaft, Wiesbaden-Biebrich, Germany, a corporation of Germany No Drawing. Filed Jan. 4, 1967, Ser. No. 607,156
Claims priority, application Germany, Jan. 7, 1966, K 58,084
Int. Cl. G03c *5/00*
U.S. Cl. 96—35.1 10 Claims

ABSTRACT OF THE DISCLOSURE

The present invention relates to a reproduction layer which comprises, as the light-sensitive component, novel polymers of the polyether type which undergo a reduction of their solubility or become insoluble as a result of the action of light.

The preparation of light-sensitive vinyl polymers and their use in reproduction layers is known. Thus, it has been proposed e.g. in British patent specification No. 893,616, to use, as the light-sensitive component in reproduction layers, acetals of polyvinyl alcohol with aldehydes of the following general formula:

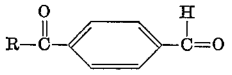

wherein R is methyl, aralkyl or aryl.

Further, polyketones are known as light-sensitive components of reproduction layers from U.S. Patent No. 2,831,768. The light-sensitive polymeric compounds mentioned in the U.S. patent are prepared, as are the first-mentioned compounds, by a later introduction of the light-sensitive ketone group into the already prepared polymer.

Further, light-sensitive vinyl polymers already have been synthesized by the introduction of a cinnamic acid or chalkone group into the polymer molecule. This method involves particular difficulties in that the free radical-initiated copolymerization of unsaturated cinnamic acid or chalkone derivatives results in copolymers which are already insoluble, i.e. cross-linked. Moreover, when cinnamic acid vinyl esters are used, cyclopolymerization occurs which leads to lactones. For these reasons, attempts have been made to first build the main chain of the polymer by radical-initiated polymerization, and then to provide this chain with the desired chalkone or cinnamic acid side chains by an esterification process.

The present invention provides novel negative-working light-sensitive layers, for the preparation of photographic copies, tanned images, relief images and printing plates, having improved characteristics.

The present invention relates to a light-sensitive reproduction layer which comprises at least one copolymer prepared from at least one epoxide of each of the following types I, II and III:

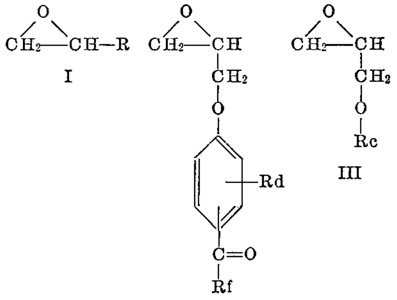

wherein:

R is hydrogen, alkyl, aryl, halogenalkyl, alkoxymethyl, allyloxymethyl, vinyloxymethyl, or aryloxymethyl;
Rc is one of the following groups:

$$—Rv—(CH{=}CH)_n—\underset{\displaystyle O}{\overset{}{\underset{\|}{C}}}—Rw$$

$$—Rv—\underset{\displaystyle O}{\underset{\|}{C}}—(CH{=}CH)_n—Rx$$

$$—Rv—(CH{=}CH)_n—\underset{\displaystyle O}{\underset{\|}{C}}—(CH{=}CH)_m—Rw$$

$$—\underset{\displaystyle O}{\underset{\|}{C}}—CH{=}CH—Rv$$

$$—Rv—CH{=}CH—\underset{\displaystyle O}{\underset{\|}{C}}—Ry$$

in which:

Rv and Rw each is a carbocyclic aromatic group which is directly linked, via carbon atom of its aromatic nucleus, to a vinylene group —CH=CH— or to the ketone group $$—\underset{\displaystyle O}{\underset{\|}{C}}—$$

Rx is a carbocyclic or heterocyclic, aromatic group which is directly linked, via a carbon atom of its aromatic nucleus, to one of the vinylene groups —CH=CH—,
Ry is an alkyl ester group, and aryl ester group, a dialkylamide group or a heterocyclic amide group, and
*n* and *m* each is a whole number from 1 to 4,
Rd is hydrogen, alkyl, alkoxy, or halogen, and
Rf is alkyl, phenyl, alkylphenyl, alkoxyphenyl or halogenphenyl.

If desired, the layer may contain known additives, such as dyestuffs, pigments, fillers, or sensitizers which are known to increase the light sensitivity of chalkones and cinnamic acid derivatives.

The reproduction layers of the invention thus comprise, as the light-sensitive component, polyethers which contain, on one molecule, different photo-active groups as side chains, viz those of the acetophenone type or the benzophenone type on the one hand, and those of the chalkone and the cinnamic acid type on the other hand.

The structure of these polyethers is illustrated by the following formula:

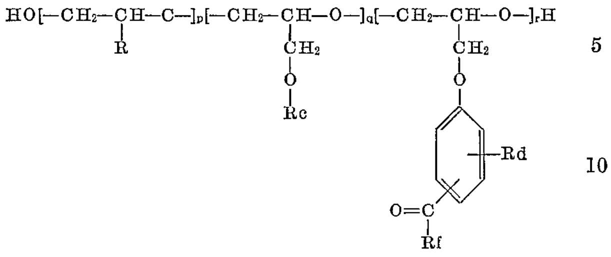

wherein:

R is hydrogen, or alkyl, preferably methyl or ethyl; aryl, preferably phenyl, methylphenyl or halogen phenyl, with fluorine, chlorine, bromine or iodine as the halogen group; or halogen alkyl, e.g. $-CH_2Cl$, $-CH_2CH_2Cl$, $-CH_2F$, $-CH_2CH_2F$, $-CHCl_2$, $-CHF_2$, $-CCl_3$, $-CH_2CCl_3$, $-CF_3$, $-CH_2CF_3$, $-CHClCH_2Cl$, and $-CHFCH_2F$; alkoxymethyl with 1 to 5 carbon atoms in the alkoxy group; allyloxymethyl; vinyloxymethyl; aryloxymethyl, preferably phenyloxymethyl or alkylphenyloxymethyl with 1 to 5 carbon atoms in the alkyl group;

Rc is a group having a chalkone or cinnamic acid group,

Rd is hydrogen or alkyl, preferably methyl or ethyl; or alkoxy, preferably methoxy or ethoxy; or halogen, preferably chlorine or bromine, Rf is alkyl having, e.g., from 1 to 5 carbon atoms, or phenyl or alkylaryl with 1 to 5 carbon atoms in the alkyl group; or alkoxyaryl with 1 to 5 carbon atoms in the alkoxy group, or halogen aryl with fluorine, chlorine, bromine or iodine as the halogen component, and

*p*, *q* and *r* are whole numbers.

The two kinds of light-sensitive components of type II and type III together should be incorporated in a quantity of at least 0.01 mole percent, preferably more than 0.1 mole percent.

Terpolymers which are of particular interest for the purposes of the invention are those which contain 0.1 to 10 mole percent of the two types of photo-active compounds II and III, based on the molar sum of components of the terpolymer. In principle, the amount incorporated may be even larger, but for economic reasons a larger quantity of light-active components II and III will not normally be employed, because the advantage obtained is not sufficient to justify the incorporation of a larger amount.

The polymers to be used according to the present invention as components of reproduction layers comprise terpolymers with monomeric units arranged in an irregular distribution according to statistical probability, and those terpolymers which, in the arrangement of their monomeric units and in their steric structure, resemble any of the mixed types of terpolymers, e.g. block polymers.

The reproduction layers of the invention may be used with great advantage in many fields. One of the technical advantages of the light-sensitive polymers of the invention is that they can be more easily prepared than the hitherto known polymers. Moreover, the polymer solutions obtained by the polymerization process can be used directly for coating. As a further advantage, even small quantities of light of the wavelength range of about 2000 to 7000 A. change the novel reproduction layers to such an extent that, after image-wise exposure, copies of the original used can be prepared within a short time by a suitable developing process and the application of pigmented substances.

Reproduction layers which contain, as photo-active polymers, terpolymers of ethylene oxide with photo-active oxiranes of the types II and III are of particular interest. Numerous polymers of this type, for instance those which are synthesized from 95 percent by weight and more of ethylene oxide units, are soluble in water as well as in anhydrous organic solvents, e.g. in aromatic substances, such as benzene or toluene. Reproduction layers prepared from these terpolymers can be developed particularly well and easily with water or aqueous solutions. However, terpolymers with a lower content of ethylene oxide, down to 50 percent by weight, also may be developed with water or with aqueous solutions.

Solutions of photo-active polymers in hydrocarbons have the advantage that they can be applied to many pre-coated supports without dissolving the pre-coat. The same applies to the photo-active polymers of this invention which are insoluble in water. Other conventional solvents, e.g., alcohol or dioxane, which normally are used together with known photo-active polymers, are much less suitable for application to a previously applied coating. Coating solutions containing only organic solvents have the further advantage that they form more uniform layers on the support upon drying than do partially or completely aqueous solutions.

The terpolymers of the invention have the further advantage that even when only small amounts of photo-active monomers, e.g. from 1 to 10 percent by weight (which, in the case of terpolymers of ethylene oxide, corresponds to about 0.2 to 2 mole percent) are incorporated, reproduction layers are obtained which are so light-sensitive that, when the pigment process is employed, copies of an original may be produced within 1 to 5 seconds by the action of sunlight and within 2 minutes by the action of a 60 watt incandescent lamp at a distance of 10 cm. This means that only very small amounts of the expensive photo-active component must be incorporated in the polymer.

In contradistinction to known pigment processes, e.g. the so-called anthracotype process, which are positive-working dusting processes using reproduction layers with smooth surfaces, the process performed with the reproduction layer of the invention is negative-working.

In the preparation of offset printing plates, it is an advantage of the reproduction layer of the invention that it permits a particularly simple performance of the so-called reversal process, without decoating, i.e. without removal of the light-hardened reproduction layer before printing, because the layer is hydrophilic.

If the process of the invention is used for decorating ceramics, it should be noted that, contrary to known processes, decorating may be performed by a negative-working pigment process.

Since the novel reproduction layer of the invention may be either disposed on any desired support, such as metal (e.g. single metal or multi-metal plates), paper, plastic, glass, ceramics etc., or may be used in the form of a self-supporting film, it is suitable for many purposes, e.g. for the preparation of printing plates, in particular for planographic and offset printing, and also for screen printing. Further, the novel reproduction material may be used for the preparation of so-called printed circuits (etched resists) and of printing plates for use in relief and intaglio printing.

The reproduction layer of the invention also may be used for the preparation of originals for transfer printing.

An important field of application for the reproduction layers of the invention is the preparation of single copies on various supporting materials, either by the contact process or by projection, e.g. by reenlargement from microfilms. Further, the reproduction layer of the invention may be used for applying image patterns or text, e.g., to machine housings, glass or ceramics, which then may be burned in after a suitable pigment or enamel color has been applied. Alternatively, colors, pigments or phosphores may be incorporated in the reproduction layer. In this case, the areas of the layer not struck by light during exposure may be washed away so that colored images are obtained which may then be burned in, if desired, (tanned and relief images, Braille).

On transparent supporting material, colored copies also may be prepared from color separation negatives, which may be combined by superposition to form a colored image.

The reproduction layer of the invention may be combined with known reproduction layers. Thus, the photoactive polyethers may be incorporated in diazotype layers or in photopolymer reproduction layers, especially photopolmer layers which are modified with polyethylene oxide.

The photo-active copolymers used as components of reproduction layers in accordance with the present invention are prepared by copolymerization of epoxides of the following general formulae:

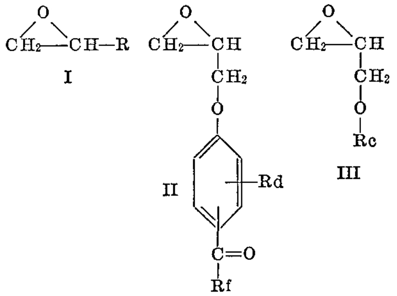

in the presence of ionic catalysts which, under the polymerization conditions prevailing, cause opening of the oxirane rings.

The following compounds may be used, e.g. as ketone components II in the preparation of the terpolymers employed in the reproduction material of the present invention:

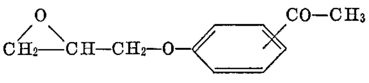

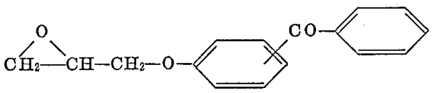

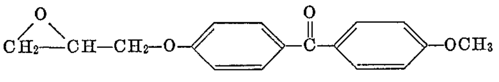

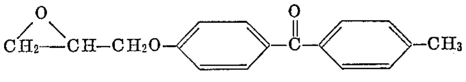

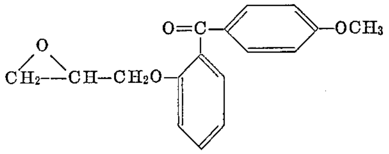

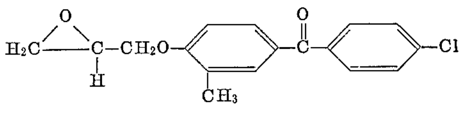

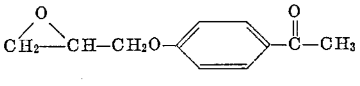

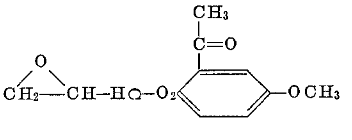

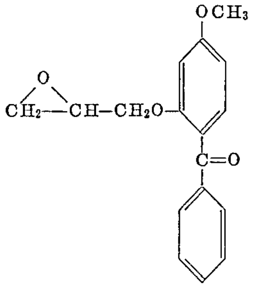

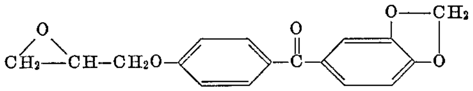

The following compounds may be used, e.g., as components III in the preparation of the terpolymers employed in the reproduction material of the present invention:

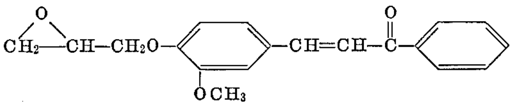

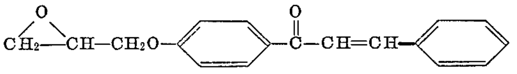

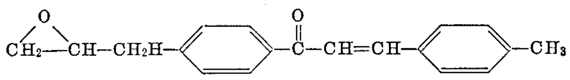

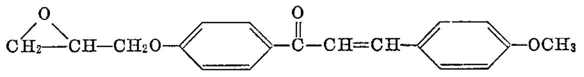

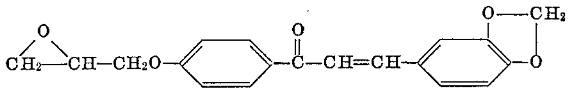

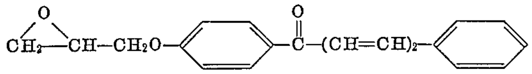

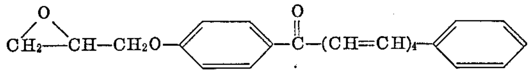

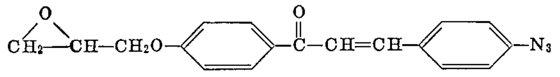

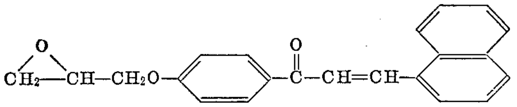

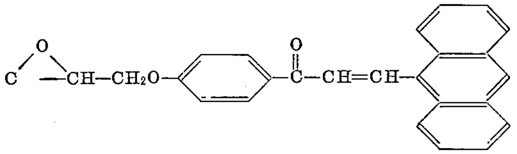

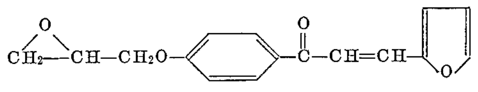

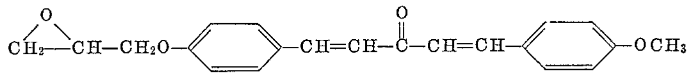

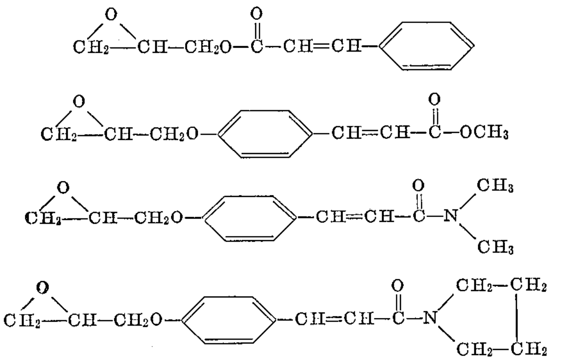

The following compounds are particularly suitable as components I: ethylene oxide, propylene oxide, 1,2-butylene oxide, styrene oxide, epichlorohydrin, epibromohydrin, vinylglycidyl ether, allylgycidyl ether, and phenylglycidyl ether, in particular ethylene oxide and propylene oxide, epichorohydrin and phenylglycidyl ether.

For the polymerization process, ionic catalysts are suitable which, under the conditions of the polymerization process, cause an opening of oxirane rings. Alkali hydroxides and alkaline earth hydroxides may be used, e.g., as catalysts, also calcium amide, zinc carbonate, iron(III)-chloride, iron(III)-alkoxides, iron(III)-salts, $SbCl_5$, $SnCl_4$, $BF_3$, and $BF_3$-etherate. The preferred catalysts are organic compounds of the metals aluminum, zinc, and magnesium corresponding to the general formula:

$$MeR'R''_{x-1}$$

wherein:

Me is a metal of the valence $x$,
R' is alkyl, preferably methyl or ethyl, and
R'' is H, alkyl, preferably methyl or ethyl; alkoxy, preferably methoxy or ethoxy; or hydroxyl.

The catalysts are prepared in known manner from metal alkyls to which specific small quantities of water and complex formers are added.

Terpolymerization is effected at temperatures ranging from 20 to 100° C., preferably from 30 to 80° C.

Suitable solvents for performing the polymerization process are, e.g., aliphatic and aromatic hydrocarbons, preferably aliphatic hydrocarbons with boiling points between 50 and 150° C., benzene, toluene, chlorinated hydrocarbons, preferably carbon tetrachloride, and, if desired, ether.

It has been found to be advantageous to exclude the action of daylight and normal room light during the polymerization reaction and the ensuing processing of the polymer products. The cross-linking process proceeds considerably slower in a solution than in the solid substance.

Advantageously, terpolymerization should be effected in the absence of oxygen, e.g. in a nitrogen atmosphere. It is absolutely necessary to prevent the access of moisture insofar as possible.

Preferably, those polymers are used in the reproduction layer of the invention which are solid at room temperature. However, polymers which are pasty or liquid at room temperature also may be employed.

Generally, the effects obtained by exposure of terpolymers which contain compounds of the benzophenone type as component II are superior to those obtained with corresponding terpolymers containing compounds of the acetophenone type. Further, the effects are normally more pronounced in the case of terpolymers containing, as component II, compounds in which the glycidoxy group is in o-position to the ketone carbonyl group.

The solubility characteristics of the terpolymers vary within wide limits, depending upon the substituents R, Rc, Rd, and Rf. For instance, the terpolymers of ethylene oxide (R=hydrogen) are at least partially soluble or dispersible in water, as the case may be, up to relatively high proportions of components II and III. By selecting different components I, e.g. propylene oxide or epichlorohydrin (R=methyl or $CH_2Cl$), terpolymers are obtained which are insoluble in water. By an additional incorporation of ethylene oxide, however, terpolymers again may be obtained which are at least partially soluble or dispersible in water.

Preferably, not more than 70 percent by weight of component I, wherein R is aryl, halogenmethyl or aryloxymethyl, and less than 20 percent by weight of component I, wherein R is allyloxymethyl, should be incorporated in the polymer, since the incorporation of larger quantities may result in a very low solubility even of the (unexposed) polymer, as a result of which processing is impeded.

By exposing the polymers to light of a wavelength between 2000 and 7000 A., their solubility in solvents which dissolve the unexposed polymers is reduced or destroyed. Particularly suitable light sources are those which emit a high proportion of ultra-violet radiation, e.g. in the range between 3000 and 4000 A. However, light sources which emit a small proportion of actinic light, e.g. the incandescent tungsten lamps normally used for room illumination, also may be used. Further, all types of lamps customarily used in reproduction processes may be used as light sources, e.g. carbon arc lamps, xenon lamps, mercury vapor lamps, actinic and superactinic luminous substance lamps, and photographic flood lights, etc. Sunlight also is very suitable.

Image-wise exposure of the reproduction layer of the invention may be effected with varying exposure times and indifferent ways, depending upon the combination of substances present, the supporting material used, and the desired result. The possibilities range from a contact exposure in a vacuum frame with a plastic or glass cover, to exposure by means of a projector or in a camera, if desired with simultaneous enlargement or reduction of scale. Accordingly, the exposure time may range from fractions of a second to several hours.

Depending upon the composition of the photo-active terpolymers, terpolymers and light-decomposition products thereof are obtained which possess a variety of gradated physical properties. For instance, terpolymers which contain as component I primarily compounds in which R is not hydrogen, are difficultly soluble to insoluble in water and oleophilic, i.e. they accept the usual greasy printing inks. If the terpolymers contain, as component I, only or preponderantly ethylene oxide, light-decomposition products are obtained which are preponderantly hydrophilic, i.e. they accept greasy ink less readily or not at all.

Terpolymers which contain, as component I, more than 50 percent by weight of ethylene oxide, are a particularly valuable group of compounds, since they permit development of the image-wise exposed reproduction layer with water or at least with solvents having a high water content.

Terpolymers with a high percentage of ethylene oxide which yield hydrophilic light-decomposition products permit a particularly simple and thus technically advantageous performance of the so-called reversal process for the preparation of offset plates, because the light-hardened reproduction layer need not be removed before printing.

For the preparation of the reproduction material, the reproduction layers of the invention are applied to the support in known manner, e.g. by coating, whirl-coating, swabbing, dip-coating, or roller application, or by laminating the reproduction layer in the form of a self-supporting film to a support, and the layers then are dried by means of a current of warm air. Especially when thicker layers are to be applied, it may be advisable to pre-coat the support with an antihalation coating. Conventional additives, such as dyestuffs, sensitizers for increasing the light-sensitivity of chalkone and cinnamic acid derivatives, pigments, wetting agents, plasticizers, anti-oxidants and stabilizers against thermal decomposition, as well as organic and inorganic fillers, may be incorporated in the reproduction layer. Suitable organic fillers are, e.g., photo-inactive polyethers, e.g. homopolymers or copolymers of different epoxides of the above defined type I, or other polymers which are compatible with the photo-active polyethers, e.g. those of the vinyl polymer series. Suitable inorganic fillers are, e.g., glass powder, silicon dioxide in extremely fine distribution and clay. These additives must be selected in such a manner, however, that they impede as little as possible the optical transparency of the reproduction layer in the main range of absorption of the light-sensitive terpolymers.

Depending upon the type of light-sensitive polymer used, development of the image-wise exposed reproduction materials may be effected with water or with organic solvents, e.g. lower aliphatic alcohols, such as methanol or ethanol, carboxylic acid esters, such as methyl acetate or ethyl acetate, aliphatic ketones, such as methylethyl ketone or acetone, aromatic hydrocarbons, such as benzene or toluene, or ethers, such as dioxane or tetrahydrofuran, or with mixtures of these organic solvents with one another or with water.

Insofar as they do not already contain dyestuffs, the exposed areas of the layer then may be dyed, e.g. with aqueous dyestuff solutions, with solutions of dyestuffs in organic solvents, or with greasy printing inks, depending upon the characteristics of the particular layer, in order to improve the visibility of the image obtained.

In a preferred modification of the method for dyeing the image, which is particularly suitable for water-developable reproduction layers and the preparation of single copies, the dry layer is dyed, after exposure, with a very finely pulverized organic or inorganic pigment and then developed by spraying with water. During the spraying process, the pigment is removed much earlier from the areas not struck by light than from the light-struck areas. By this process, sharp copies which are fast to light may be produced, with short exposure times, in any desired color.

Particularly in the case of the above described pigment process, but also when other processing methods are employed, the following should be noted: It is possible, but not advisable to use a supporting material which has an extremely smooth surface. Advantageously, the support should be superficially roughened by mechanical or chemical methods because this improves the adhesion of the reproduction layer. A surface with particularly favorable properties in this respect is, e.g., electrolytically roughened aluminum foil. Since the functioning of the reproduction layers of the invention can be demonstrated on this type of support without problems of lack of adhesion, this support preferably is used in the following examples.

Especially when the pigment process is to be performed, a reproduction layer of such thickness must be applied that all protruding grain peaks of the support are completely covered by the reproduction layer. Otherwise, the pigment would also be held by the uncovered grain tops from which it could be removed only with difficulty, or not at all, in the ensuing washing process. The smoother the surface, the thinner the reproduction layer which can be employed, which is of advantage because of the shorter exposure times applicable. An unduly extended exposure may reduce the receptivity of the light-struck areas for the pigment and their adhesiveness thereto.

During development with a water spray, a low water pressure preferably is employed. In the case of unfamiliar layers the developing characteristics of which are not known, development is begun at a very low water pressure, which then is increased until development proceeds with satisfactory speed and safety. As a by-result of this process, the pigment adhering to the light-struck areas is covered with a solution of the unexposed reproduction layer in water. As a consequence, a pigment copy is obtained upon drying which is relatively fast to marring. The fastness to marring and wiping may be further increased by subjecting the copy to a short after-exposure.

The invention will be further illustrated by the following examples. The quantities are stated as parts by weight; percentages are by weight. The temperature references are to degrees centigrade.

In the following, a number of dyestuffs and pigments used in the examples are described:

Victoria Blue B—Color Index No. 44045
Heliogen Blue B—Color Index No. 74160
Paratoner B—Schultzs "Farbstofftabellen," 7th edition, vol. I, 1931, No. 60
Crystal Violet—Schultz' "Farbstofftabellen," 7th edition, vol. I, 1931, No. 785
Fatty Red HRR—A dyestuff of the formula $C_{22}H_{16}N_4O$ which is prepared from diazotized 4-amino-azobenzene and β-naphthol.

EXAMPLE 1

An electrolytically roughened aluminum foil is coated with a 1 percent solution of a terpolymer prepared from 19.5 parts by weight of ethylene oxide, 0.5 part by weight of 4-glycidoxybenzophenone, and 0.5 part by weight of a glycidoxy chalkone having the following formula

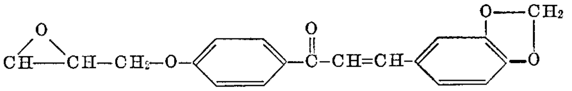

in a solvent mixture made up of 12.5% of toluene, 12.5% dioxane, and 75% of benzene. After drying the coating, the reproduction material obtained is exposed under a negative original. The light source used is an illuminating device equipped with thirteen 40 watt fluorescent tubes of the type TL–AK40V/05 mounted in a plane of 60 x 60 cm. The exposure time is 30 to 60 seconds; the distance from the lamp is 7 to 8 cm. The plate is then developed with water and dyed either with a 2 to 3 percent alcoholic solution of Victoria Blue B or an aqueous solution of Crystal Violet. After rinsing with water, a deep-blue positive image is obtained which may be used for reprinting while it is still wet.

The terpolymer is prepared as follows:

100 parts by weight of toluene and 6.15 parts by weight of a catalyst solution consisting of 4.12 parts by weight of aluminum triethyl dissolved in a mixture of 11.23 parts by weight of n-heptane and 6.94 parts by weight of diethylether, 0.31 part by weight of water, and 1.76 parts by weight of acetyl acetone are placed in a polymerization vessel protected against the action of light and, while agitating, a mixture of 9.75 parts by weight of ethylene oxide, 0.25 part by weight of piperonal acetophenone-(4-glycidylether, and 0.25 part by weight of 4-benzolylphenylglycidylether, and 0.25 part by weight of 4-benzoylphenylglicidylether is added drop-wise over a period of 1 hout at a temperature of 60° C. The mixture is agitated for 7 hours at 60° C., and the polymerization process is then interrupted by adding 2 parts by weight of ethanol. The solution is evaporated at 50° C. under reduced pressure. Yield: 78%.

EXAMPLE 2

The method described in Example 1 is repeated, using, however, a 1 percent solution of a terpolymer of ethylene oxide, 4-glycidoxybenzophenone and cinnamic acid glycidylester. The polymer is prepared analogously to the method of Example 1, from 19.5 parts by weight of ethylene oxide, 0.5 part by weight of 4-glycidoxybenzophenone, and 0.59 part by weight of cinnamic acid glycidylester (85%).

EXAMPLE 3

An electrolytically roughened aluminum foil is coated with a 1.37 percent solution of the terpolymer used in Example 1. The foil is dried, first with a current of warm air and then for 3 minutes at 100° C. Exposure is effected for 10 minutes under a positive original, employing the conditions of Example 1. Then, the areas of the layer which were not affected by light are removed by spraying with water and the foil is dried. The foil then is etched with the etching solution described below, again rinsed with water, dried, and lacquered with a lacquer of the following composition:

| | Parts by wt. |
|---|---|
| Chlorinated rubber of a viscosity of 35–55 cp. | 5.8 |
| Chlorinated rubber of a viscosity of 80–105 cp. | 5.8 |
| Resin acid-modified phenol resin | 5.0 |
| Xylene | 67.0 |
| Mesitylene | 17.0 |
| Fatty Red HRR | 0.4 |

After drying, the lacquer is removed from the light-hardened areas of the reproduction layer by wiping with a 1.5 percent aqueous solution of phosphoric acid. The plate now may be used with good results as an offset printing plate, without having to remove the hardened reproduction layer from the non-image areas, because the hardened reproduction layer is hydrophilic and does not accept greasy ink.

A solution of the following composition may be used, e.g., as the etching solution:

| | Parts by wt. |
|---|---|
| $CaCl_2 \cdot 2H_2O$ | 41.0 |
| Water | 44.0 |
| $ZnCl_2$, dessicated | 5.6 |
| $FeCl_3 \cdot 6H_2O$ | 2.8 |
| HCl (36.5%) | 0.5 |
| Ethanol | 6.0 |

EXAMPLE 4

For the preparation of a blue-colored, tanned image, a 1 percent benzene solution of the terpolymer of ethylene oxide, 4-glycidoxybenzophenone and cinnamic acid glycidylester used in Example 2 above is mixed with 80 percent, calculated on the solids content of the solution, of powdered Heliogen Blue B, and the solution thus prepared is coated onto an electrolytically roughened aluminum foil. The material is exposed for 1 minute under a negative original, under the exposure conditions of Example 1, and then developed by spraying with water. A blue-colored image on a clean background is obtained. In this manner, e.g., inscriptions may be applied or signs manufactured.

EXAMPLE 5

A sheet of baryta paper is coated, on a plate whirler, with a 0.8 percent solution of a terpolymer prepared from 19 parts by weight of ethylene oxide, 0.5 part by weight of 4-glycidoxybenzophenone, and 0.5 part by weight of a glycidoxy chalkone having the following formula:

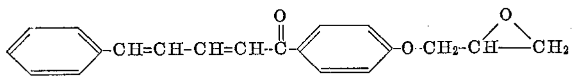

in a toluene/dioxane mixture. Drying is performed with a current of warm air and then 2 minutes at 100° C.

In a conventional vacuum printing frame, the material is then exposed for 2 seconds under a negative original, using a 40 amp. carbon arc lamp at a distance of 1 m. as the light source. The dry layer is dyed with very finely powdered Paratoner B, which is readily accepted by the entire layer. The layer then is rinsed with a water spray so that the pigment is flushed off from the areas not struck by light. A red-colored positive copy of the original is obtained.

The preparation of the terpolymer is analogous to the procedure of Example 1.

EXAMPLE 6

For the preparation of an offset printing plate, an electrolytically roughened aluminum foil is coated on a plate whirler with a 1.3 percent solution in toluene/dioxane of a polymer, prepared from 12 parts by weight of propylene oxide, 7 parts by weight of phenylglycidylether, 0.5 part by weight of 4-glycidoxybenzophenone and 0.5 part by weight of a glycidoxy chalkone having the following formula:

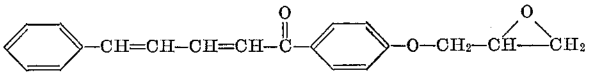

The plate is dried, first with a current of warm air, then for 2 minutes at 100° C. It is then exposed for 2 minutes under a negative original, under the conditions of Example 1 and using the light source described in detail in that example.

Development is effected in an ethyl acetate bath, if desired with slight swabbing with a cotton pad. After spraying with ethyl acetate, the plate is dried. It then is treated with a 1.5 percent aqueous solution of phosphoric acid to which 0.5 percent of sodium fluoride has been added. After rinsing with water, the plate is inked with greasy ink. Cleaning of the printing plate by an after-treatment with the aqueous phosphoric acid solution described above may be necessary.

A positive printing plate is thus obtained from which a large number of prints can be made.

The polymer was prepared according to the procedure of Example 1.

EXAMPLE 7

An electrolytically roughened aluminum foil is coated, on a plate whirler, with a 0.92 percent benzene solution of a terpolymer prepared from 19 parts by weight of ethylene oxide, 0.5 part by weight of 4-glycidoxybenzophenone, and 0.57 part by weight of an (88%) glycidoxy chalkone having the following formula:

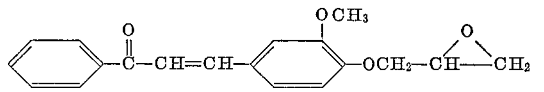

Drying is performed first with a current of warm air and then for 2 minutes at 100° C.

After image-wise exposure under a negative, either for 2 to 4 seconds to a 40 amp. carbon arc lamp at a distance of 1 m. or for 2 to 3 minutes to a tungsten incandescent lamp at a distance of 10 cm., the entire layer is dyed, e.g. with carbon black, and then treated with a water spray. A deep black positive copy of the original is produced on a clean background.

The terpolymer is prepared by the method described in Example 1.

EXAMPLE 8

An electrolytically roughened aluminum foil is coated, on a plate whirler, with an approximately 1 percent solution of the terpolymer used in Example 1 to which about 0.5 percent of acetic acid, based upon the weight of the solution, is added.

After the foil is dried, a microfilm negative is projected on its layer side at an enlargement scale of 1:10 by means of a conventional optical system. A high-pressure mercury vapor lamp of the type HBO500 manufactured by Osram is used as the light source and the exposure time is 1 minute.

Then, the entire layer is dyed with carbon black FW2. When the foil is then cautiously sprayed with water, a positive enlargement of the microfilm is obtained.

EXAMPLE 9

An electrolytically roughened aluminum foil is coated with a coating solution of the following composition:

13.4 parts by weight of a benzene solution (solid content: 2.65%) of a polymer prepared from 19 parts by weight of ethylene oxide, 0.5 part by weight of cinnamic acid glycidylester, 0.25 part by weight of 4-glycidoxybenzophenone, and 0.25 part by weight of 4-glycidoxyacetophenone, 0.04 part by weight of a highly dispersed pure silicic acid marketed by Degussa, Frankfurt, under the designation "Aerosil MOX170,"
0.04 part by weight of a polyethylene oxide having a molecular weight of 4,000,000, and
0.002 part by weight of 2-phenylamino-naphthalene, made up with benzene to a total of 50 parts by weight.

The foil is then dried, first with a current of warm air, then for 2 minutes at 100° C. It is then exposed for 20 to 30 seconds under a negative original to a 40 amp. carbon arc lamp at a distance of 1.2 m. The entire surface of the layer is then rubbed in with carbon black FW2 and rinsed with a water spray until the pigment is completely dissolved away from the unexposed areas. A black positive copy of the original is obtained.

The polymer is prepared according to the procedure of Example 1.

EXAMPLE 10

Plates of unburned clay and unburned porcelain are coated with a 1.4 percent benzene solution of a terpolymer prepared from 19 parts by weight of ethylene oxide, 0.5 part by weight of 2-glycidoxy acetophenone, and 0.5 part by weight of a chalkone having the following formula

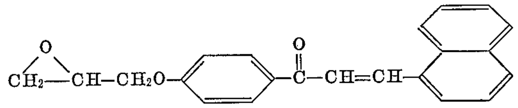

After drying for 1 minute at 100° C., a second coating of the solution is applied and dried in the same manner.

The plates are then image-wise exposed for 15 to 30 seconds under a negative original, using a 40 amp. carbon arc lamp at a distance of 1 m. The entire surface of the layer then is dyed with a pigment or a very finely pulverized enamel color and treated with a water spray until the areas not struck by light are freed from the pigment or color.

The positive pigment or color image thus produced may be burned in. It is an advantage of the novel reproduction layer that it contains only carbon, oxygen, and hydrogen, 1 part by weight of a chalkone of the formula:

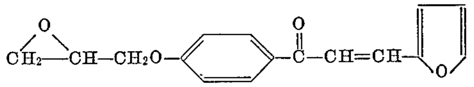

and 3 parts by weight of a monomeric ketone of the formula:

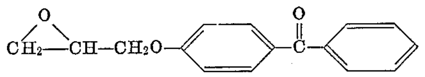

The coated foil is dried first with a current of warm air and then for 2 minutes in a drying oven at 100° C.

After image-wise exposure, under a line negative (light source: 40 amp. carbon arc lamp at a distance of 1 m.; exposure time: 10 to 20 seconds) the entire layer is rubbed in with a finely ground pigment and then rinsed with water until the pigment has been washed away from the areas of the layer not struck by light. A positive copy of the original is obtained.

Equally good results are obtained when the above method is repeated, using either a 2 percent solution of a terpolymer prepared from 95 parts by weight of ethylene oxide, 4 parts by weight of the compound of formula:

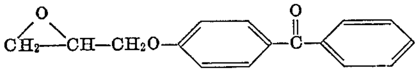

and 1 part by weight of the compound of formula:

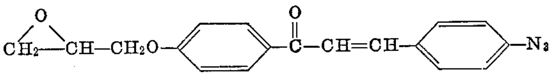

or a 2 percent solution of the terpolymer prepared from 95 parts by weight of ethylene oxide, 4 parts by weight of the compound corresponding to formula:

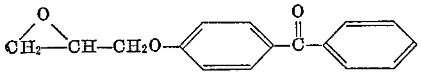

and 1 part by weight of the compound corresponding to formula:

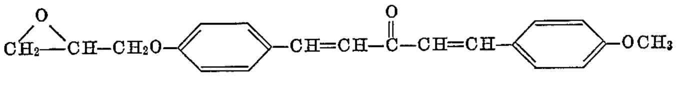

besides some aluminum, i.e. no elements which form colored combustion residues, as do, e.g. reproduction coatings based on iron citrate or chromate/colloid coatings.

EXAMPLE 11

The same coating as in Example 10 is used for coating a clear cellulose acetate film, on a plate whirler.

After image-wise exposure under a negative original (exposure time: 30 seconds; light source: a 40 amp. carbon arc lamp at a distance of 1 m.) the entire layer is dyed with Carbon Black FW2 and then carefully treated with a water spray. A black positive copy of the original is obtained.

EXAMPLES 12–14

An electrolytically roughened aluminum foil is coated on a plate whirler with a 2 percent benzene solution of a polymer prepared from 95 parts by weight of ethylene oxide, 1 part by weight of a chalkone of the formula

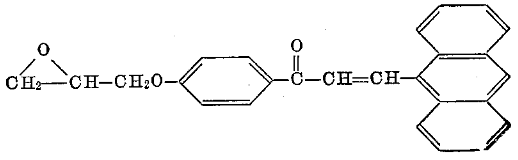

The polymers used in Examples 12 to 14 are prepared according to the procedure of Example 1.

Further, copolymers prepared from at least one epoxide of the type I stated above and at least one epoxide of the type II stated above, also may be used as light-sensitive components of reproduction layers, and similarly copolymers prepared by copolymerization of at least one epoxide of the above type I with at least one epoxide of type III above. However, light-sensitive reproductive layers which contain only one or more copolymers of this type, or consist of such copolymers, are not within the scope of the present invention.

Useful reproduction layers also are obtained if the layers consist of a mixture of light-sensitive polymers consisting only in part of copolymers of epoxides of the above types I, II, and III, and including a portion either of a copolymer of epoxides of the above types I and II, or a copolymer of epoxides of the above types I and III. Reproduction layers of this type, and reproduction materials containing reproduction layers of this type, are within the scope of the present invention.

EXAMPLE 15

An electrolytically roughened aluminum foil is coated with a solution wihch consists of 0.4 percent of the terpolymer described in Example 1, 0.5 percent of a copolymer prepared from 19 parts by weight of ethylene oxide and 1 part by weight of 4-glycidoxy benzophenone, and 0.5 percent of a copolymer prepared from 19.5 parts by weight of ethylene oxide and 0.5 part by weight of a glycidoxy chalkone of the formula stated in Example 1, dissolved in a mixture made up of 12.5 percent of toluene, 12.5 percent of dioxane, and 75 percent of benzene. The foil is dried and then further processed as described in Example 1 above.

EXAMPLE 16

The procedure described in Example 6 is repeated, using, however, a coating solution which contains 0.9 percent of the polymer described in Example 6 and 0.4 percent of a terpolymer prepared from 12 parts by weight of propylene oxide, 7 parts by weight of phenylglycidylether, and 1 part by weight of 4-glycidoxybenzophenone.

EXAMPLE 17

The procedure described in Example 7 above is repeated, using, however, a coating solution which contains 0.8 percent of the terpolymer described in Example 7 and 0.12 percent of a copolymer prepared from 9.5 parts by weight of ethylene oxide and 0.57 part by weight of a glycidoxy chalkone (85%) corresponding to the formula stated in Example 7.

EXAMPLE 18

This example shows that only very little of the polymer used according to the invention need be contained in the light-sensitive layer.

95 parts by weight of ethylene oxide, 2.5 parts by weight of glycidoxy benzophenone, and 2.5 parts by weight of the glycidoxy chalkone used in Example 5 above were terpolymerized in toluene in accordance with the procedure described in Example 1. After 80% of the monomeric compounds had reacted, the toluene solution of the polymer contained 5.2 percent of polymer.

Part of this solution was mixed with sufficient polyethylene oxide (molecular weight: 600,000) and sufficient benzene that the resulting solution contained 5 percent of the polymer component, which consisted of 2 percent of the light-sensitive polymer and 98 percent of polyethylene oxide.

Aluminum foils with electrolytically roughened surfaces were coated with this solution and dried. Layers weighing 0.23 mg./cm.$^2$ were formed on the aluminum surfaces.

One of the sensitized aluminum foils thus obtained was exposed for 3 minutes to a negative line original under the conditions of Example 1. The exposed layer then was dyed with Paratoner B and rinsed with water until the pigment had been removed from the unexposed areas of the layer. A positive red copy was produced on the foil.

Another of the aluminum foils, sensitized as described above, was exposed for 5 minutes under the same conditions as above, and the exposed layer then was rinsed with water, dried, wetted with a 1 to 2 percent alcoholic solution of Victoria Blue B, and again rinsed with water. A blue-colored positive image was obtained on the foil.

It will be obvious to those skilled in the art that many modifications may be made within the scope of the present invention without departing from the spirit thereof, and the invention includes all such modifications.

What is claimed is:

1. A supported light-sensitive reproduction which comprises at least one copolymer prepared from at least one epoxide of each of the following types I, II, and III:

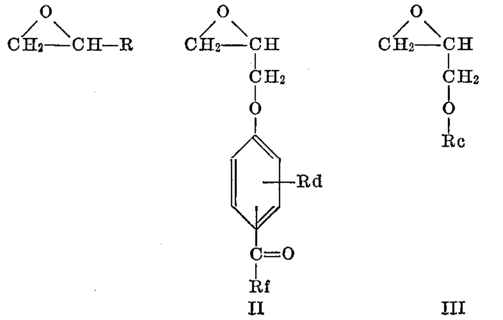

II III in which R is selected from the group consisting of hydrogen, alkyl, aryl, halogen alkyl, alkoxy methyl, allyloxy methyl, vinyloxy methyl, and aryloxy methyl; and Rc is selected from the group consisting of $$-\mathrm{Rv}-(\mathrm{CH}=\mathrm{CH})_n-\mathrm{C}(=\mathrm{O})-\mathrm{Rw}$$
$$-\mathrm{Rv}-\mathrm{C}(=\mathrm{O})-(\mathrm{CH}=\mathrm{CH})_n-\mathrm{Rx}$$
$$-\mathrm{Rv}-(\mathrm{CH}=\mathrm{CH})_n-\mathrm{C}(=\mathrm{O})-(\mathrm{CH}=\mathrm{CH})_m-\mathrm{Rw}$$
$$-\mathrm{C}(=\mathrm{O})-\mathrm{CH}=\mathrm{CH}-\mathrm{Rv}, \text{ and } -\mathrm{Rv}-\mathrm{CH}=\mathrm{CH}-\mathrm{C}(=\mathrm{O})-\mathrm{Ry}$$

in which Rv and Rw each are carbocylic aromatic groups which are directly linked, via carbon atoms of their aromatic nuclei, to one of the groups —CH=CH— and $$-\mathrm{C}(=\mathrm{O})-$$

Rx is selected from the group consisting of a carbocylic and a heterocyclic aromatic group which is directly linked, via a carbon atom of its aromatic nucleus to one of the groups —CH=CH—; Rv is selected from the group consisting of an alkyl ester group, an aryl ester group, a dialkyl amide group and a heterocyclic amide group; *n* and *m* are whole numbers from 1 to 4; Rd is selected from the group consisting of hydrogen, alkyl, alkoxy and halogen; and Rf is selected from the group consisting of alkyl, phenyl, alkylphenyl, alkoxyphenyl and halogenphenyl.

2. A reproduction layer according to claim 1 including at least one material selected from the group consisting of a dyestuff, a pigment, and a filler.

3. A reproduction layer according to claim 1 in which the molar sum of components II and III in the terpolymer is in the range of about 0.01 to 10 mole percent.

4. A reproduction layer according to claim 1 in which the terpolymer contains at least 50 percent by weight, based on the weight of the terpolymer, of ethylene oxide, incorporated as component I by polymerization.

5. A photographic reproduction process which comprises exposing a supported light-sensitive layer to light under a master and developing the resulting image by treatment with a solvent, the layer comprising at least one copolymer prtepared from at least one epoxide of each of the following types I, II, and III:

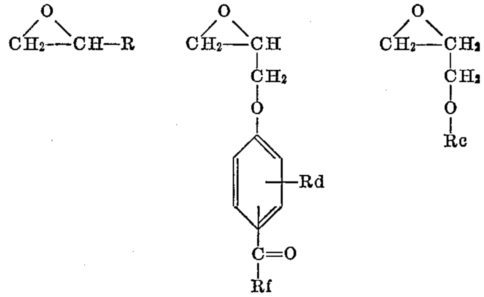

I II III in which R is selected from the group consisting of hydrogen, alkyl, aryl, halogen alkyl, alkoxy methyl, allyloxy methyl, vinyloxy methyl, and aryloxy methyl; and Rc is selected from the group consisting of $$-\mathrm{Rv}-(\mathrm{CH}=\mathrm{CH})_n-\mathrm{C}(=\mathrm{O})-\mathrm{Rw}$$
$$-\mathrm{Rv}-\mathrm{C}(=\mathrm{O})-(\mathrm{CH}=\mathrm{CH})_n-\mathrm{Rx}$$

$$-Rv-(CH=CH)_n-\overset{\overset{\displaystyle O}{\|}}{C}-(CH=CH)_m-Rw$$

$$-\overset{\overset{\displaystyle O}{\|}}{C}-CH=CH-Rv, \text{ and}$$

$$-Rv-CH=CH-\overset{\overset{\displaystyle O}{\|}}{C}-Ry$$

in which Rv and Rw each are carbocylic aromatic groups which are directly linked, via carbon atoms of their aromatic nuclei, to one of the groups —CH=CH— and $$-\overset{\overset{\displaystyle O}{\|}}{C}-$$

Rx is selected from the group consisting of a carbocyclic and a heterocyclic aromatic group which is directly linked, via a carbon atom of its aromatic nucleus to one of the groups —CH=CH—; Ry is selected from the group consisting of an alkyl ester group, an aryl ester group, a dialkyl amide group and a heterocyclic amide group; *n* and *m* are whole numbers from 1 to 4; Rd is selected from the group consisting of hydrogen, alkyl, alkoxy and halogen; and Rf is selected from the group consisting of alkyl, phenyl, alkylphenyl, alkoxyphenyl and halogenphenyl.

6. A photographic reproduction process according to claim 5 in which the layer includes at least one material selected from the group consisting of a dyestuff, a pigment, and a filler.

7. A photographic reproduction process according to claim 5 in which the exposed light-sensitive layer is colored before development with a material selected from the group consisting of a pigment and a dyestuff.

8. A photographic reproduction process according to claim 5 in which the molar sum of components II and III in the terpolymer is in the range of about 0.01 to 10 mole percent.

9. A photographic reproduction process according to claim 5 in which the terpolymer contains at least 50 percent by weight, based on the weight of the terpolymer, of ethylene oxide, incorporated as component I by polymerization.

10. A photographic reproduction process according to claim 5 in which the solvent is selected from the group consisting of organic solvents, water, and mixtures thereof.

References Cited

UNITED STATES PATENTS

| | | | |
|---|---|---|---|
| 3,200,086 | 8/1965 | Coleman | 260—2 |
| 2,831,768 | 4/1958 | Merrill et al. | 96—115 |
| 3,410,824 | 11/1968 | Atkinson | 96—115 |

NORMAN G. TORCHIN, Primary Examiner

R. H. SMITH, Assistant Examiner

U.S. Cl. X.R.

96—115, 33